United States Patent
Khwa et al.

(10) Patent No.: US 11,349,462 B1
(45) Date of Patent: May 31, 2022

(54) SELECTOR-BASED RANDOM NUMBER GENERATOR AND METHOD THEREOF

(71) Applicant: Taiwan Semiconductor Manufacturing Company, Ltd., Hsinchu (TW)

(72) Inventors: Win-San Khwa, Hsinchu (TW); Jui-Jen Wu, Hsinchu (TW); Jen-Chieh Liu, Hsinchu (TW); Elia Ambrosi, Hsinchu (TW); Xinyu Bao, Fremont, CA (US); Meng-Fan Chang, Taichung (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 17/371,051

(22) Filed: Jul. 8, 2021

Related U.S. Application Data

(60) Provisional application No. 63/156,959, filed on Mar. 5, 2021.

(51) Int. Cl.
*H03K 3/84* (2006.01)
*H03L 7/099* (2006.01)
*H03K 3/037* (2006.01)

(52) U.S. Cl.
CPC .............. *H03K 3/84* (2013.01); *H03K 3/037* (2013.01); *H03L 7/099* (2013.01)

(58) Field of Classification Search
CPC ........................................................ H03K 3/84
See application file for complete search history.

(56) References Cited

U.S. PATENT DOCUMENTS

| | | | |
|---|---|---|---|
| 2014/0028404 A1* | 1/2014 | Kihara ..................... | H03K 3/84 331/78 |
| 2015/0154006 A1* | 6/2015 | Yang ........................ | H03K 3/84 708/251 |
| 2016/0179472 A1* | 6/2016 | Sugahara ................ | G06F 7/588 708/251 |
| 2018/0129477 A1* | 5/2018 | Kim ........................ | G06F 7/588 |

* cited by examiner

*Primary Examiner* — Patrick O Neill
(74) *Attorney, Agent, or Firm* — JCIPRNET

(57) ABSTRACT

A random number generator that includes control circuit, an oscillation circuit, a dynamic header circuit, an oscillation detection circuit and a latch circuit is introduced. The control circuit sweeps a configuration of a bias control signal among a plurality of configurations. The dynamic header circuit generates a bias voltage based on the configuration of the bias control signal. The oscillation circuit generates an oscillation signal based on the bias voltage. The oscillation detection circuit detects an onset of the oscillation signal, and outputs a lock signal. The latch circuit latches the oscillation signal according to a trigger signal to output a random number, wherein the trigger signal is asserted after the lock signal is outputted, and the configuration of bias control signal is locked after the lock signal is outputted. A method for generating a random number and an operation method of a random number generator are also introduced.

20 Claims, 15 Drawing Sheets

SELECTOR-BASED RANDOM NUMBER GENERATOR AND METHOD THEREOF

CROSS-REFERENCE TO RELATED APPLICATION

This application claims the priority benefit of U.S. provisional application Ser. No. 63/156,959, filed on Mar. 5, 2021. The entirety of the above-mentioned patent application is hereby incorporated by reference herein and made a part of this specification.

BACKGROUND

A random number generator could be implemented using a selector-based oscillator with proper biasing. For example, the selector-based oscillator needs to be biased such that the voltage across the selector is between its threshold voltage (Vth) and hold voltage (Vhold). However, it is difficult to properly set the bias voltage across the selector to be exactly between the threshold voltage and the hold voltage, because of process-voltage-temperature (PVT) variation. As a result, oscillation generated by the selector-based oscillator the is impaired, and the generated random number is biased. It is desired to design a random number generator that is capable of self-sustained oscillation across PVT variation.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
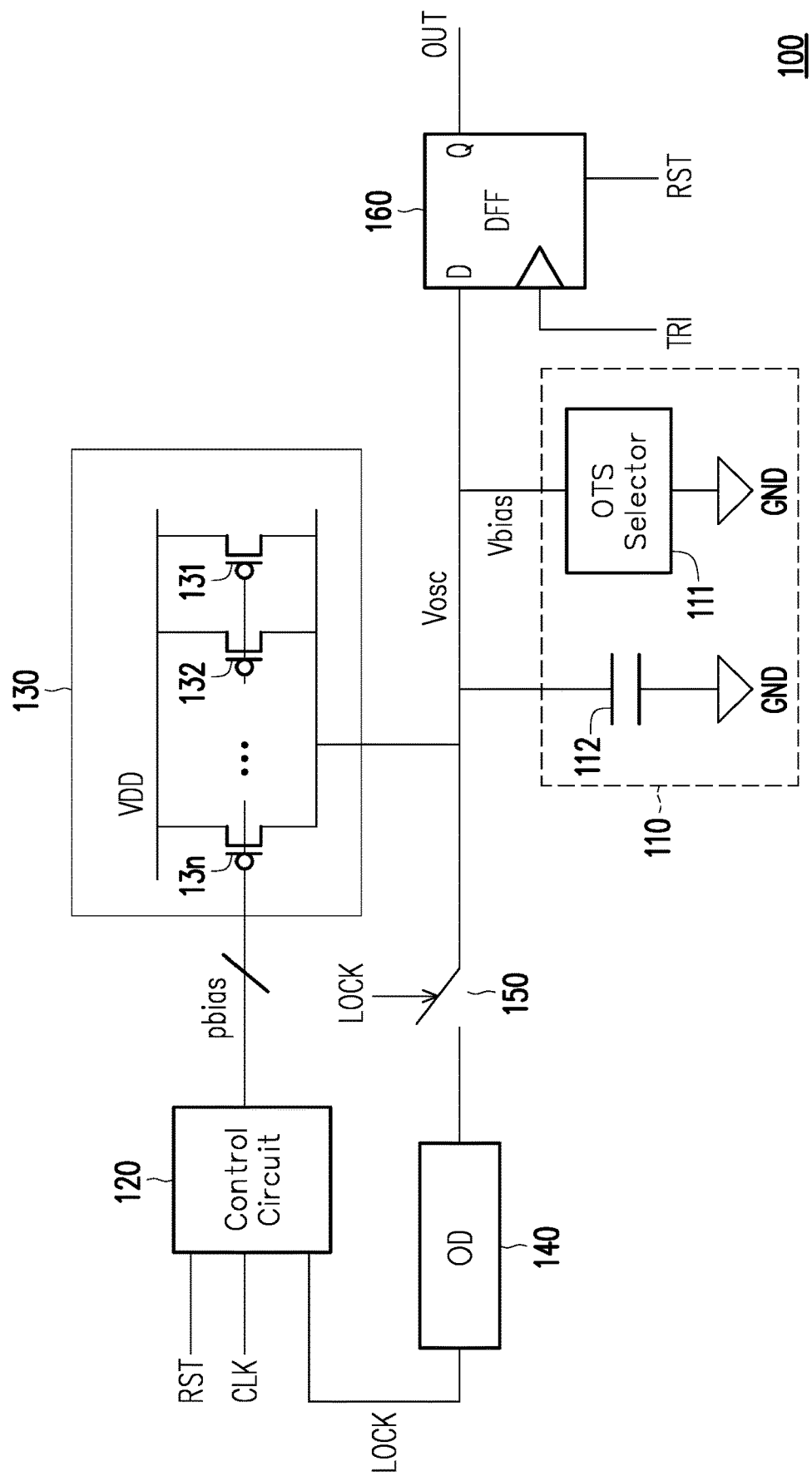
FIG. 1 is a schematic diagram of a random number generator according to some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In accordance with some embodiments, a configuration of a bias control signal is swept among a plurality of configurations, and a bias voltage is generated based on the configuration of bias control signal. An oscillation circuit that includes a selector and a capacitor is configured to generate an oscillation signal based on the bias voltage. The selector switches between a conductive state and a non-conductive state alternately and the load capacitor is charged and discharged alternately to generate the oscillation signal. An oscillation detection circuit is configured to detect onset of the oscillation signal by detecting at least one of a falling edge and a rising edge of the oscillation signal. After the onset of the oscillation signal is detected, the oscillation detection circuit outputs a lock signal that is used to lock the configuration of the bias control signal, thereby locking the value of the bias voltage applied to the oscillation circuit. Once the lock signal is outputted, a switch is controlled to decouple the oscillation detection circuit from the oscillation circuit. A latch circuit is configured to latch the oscillation signal after the lock signal is outputted to generate a digitalized random number. In this way, the bias voltage asserted to the oscillation circuit is self-calibrated and locked to proper bias voltage regardless of the PVT variation. Accordingly, the oscillation robustness of the oscillation circuit is improved, and the quality of the digitalized random number generated by the random number generator is improved.

FIG. 1 illustrates a schematic diagram of a random number generator 100 in according with some embodiments. The random number generator 100 includes an oscillation circuit 110, a control circuit 120, a dynamic header circuit 130, an oscillation detection circuit 140, a switch 150 and a latch circuit 160. It is noted that the random number generator 100 may include more or less the elements that are shown in FIG. 1.

Figure 10:
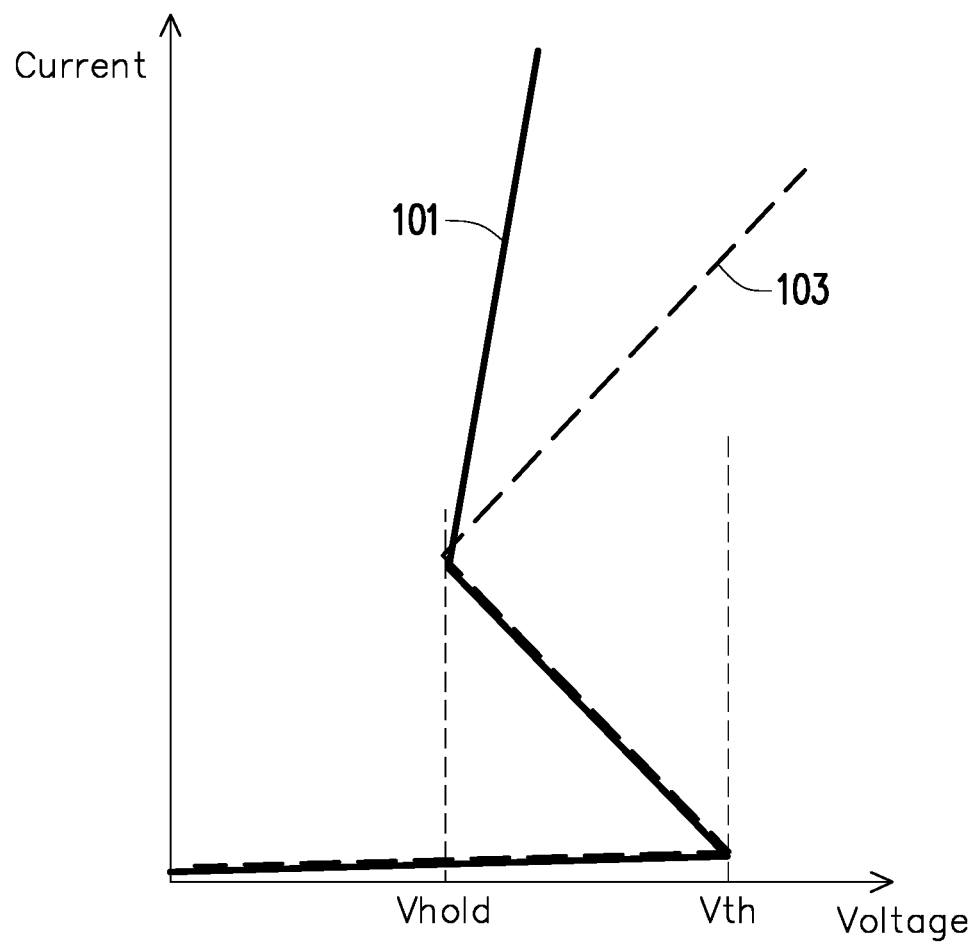
FIG. 10 illustrates current-voltage (IV) curves of a selector in an oscillation circuit of a random number generator in accordance with some embodiments.

In some embodiments, the oscillation circuit 110 includes a selector 111 and a load capacitor 112 that is coupled in parallel to the selector 111. The oscillation circuit 110 is configured to generate an oscillation signal Vosc based on the bias voltage Vbias that is applied to the oscillation circuit 110. In some embodiments, the selector 111 includes an ovonic threshold switch (OTS) that has hysteresis snapback behavior characterized by a threshold voltage Vth and a hold voltage Vhold of the OTS. The hysteresis snapback behavior of the selector 111 is illustrated through a current-voltage (IV) curve 101 in FIG. 10. Referring to FIG. 10, the horizontal axis in FIG. 10 illustrates a voltage across the selector 111, and the vertical axis in FIG. 10 illustrates a current flowing through the selector 111. When the voltage across the selector 111 has not exceeded the threshold voltage Vth, the selector 111 is in a non-conductive state. When the voltage across the selector 111 exceeds the threshold voltage Vth of the OTS, the voltage across the selector 111 drops or snapbacks to the hold voltage Vhold, and the selector 111 switches from the non-conductive state to the conductive state. The OTS remains in the conductive state until the voltage across the selector 111 decreases to below the hold voltage Vhold. When the voltage across the selector 111 decreases to below the hold voltage Vhold, the selector 111 switches from the conductive state to the non-conductive state.

In some embodiments, when a proper bias voltage Vbias is asserted to the oscillation circuit 110, the load capacitor 112 is charged and discharged alternately, and the selector 111 switches between the conductive state and the non-conductive state alternately, thereby generating the oscillation signal Vosc. Initially, the selector 111 is in the non-conductive state, and the load capacitor 112 start charging when the bias voltage Vbias is asserted to the oscillation circuit 110. As the load capacitor 112 is coupled in parallel to the selector 111, the voltage across the load capacitor 112 is same as the voltage across the selector 111. When the voltage across the selector 111 exceeds the threshold voltage Vth, the selector 111 switches from the non-conductive state to the conductive state. As a result, a discharging path is formed between the load capacitor 112 and the reference terminal GND through the selector 111. The load capacitor starts discharging through the discharging path, and the voltage across the selector 111 starts decreasing. When the voltage across the selector 111 decreases below the hold voltage Vhold of the OTS, the selector 111 switches to the non-conductive state, the discharging path of the load capacitor 112 is disconnected, and the load capacitor starts charging again. The process of alternate charging and discharging of the load capacitor 112 results in the oscillation signal Vosc at the output of the oscillation circuit 110. Since the oscillation signal Vosc is generated based on operations of the selector 111, the oscillation circuit 110 is also referred to as a selector-based oscillator.

Returning to FIG. 1, the control circuit 120 is configured to generate a bias control signal pbias that is used to control operations of the dynamic header circuit 130. In some embodiments, the control circuit 120 is configured to sweep configuration (e.g., value) of the bias control signal pbias in a decreasing or increasing strength fashion. For example, if the bias control signal pbias is a 4-bit digital value, the control circuit 120 may sweep the configuration of the bias control signal pbias in the increasing fashion from "0000" to "1111". Alternatively, the control circuit 120 may sweep the configuration of the bias control signal pbias in the decreasing fashion from "1111" to "0000." In some alternative embodiments, the bias control signal pbias is an analog signal.

In some embodiments, the control circuit 120 has input terminals to receive a clock signal CLK and a reset signal RST, in which the bias control signal pbias is generated based on the clock signal CLK, and the reset signal RST is used to reset the operation of the control circuit 120. The control circuit 120 may also have an input terminal to receive a lock signal LOCK. When the lock signal LOCK is asserted to the control circuit 120, the control circuit 120 locks the configuration of the bias control signal pbias. For example, when the configuration of the bias control signal pbias is "1011" when the lock signal LOCK is asserted to the control circuit 120, the control circuit 120 locks the bias control signal pbias at the configuration of "1011." In some alternative embodiments, the control circuit 120 locks the configuration of the bias control signal pbias after a delay period from the assertion of the lock signal LOCK.

The dynamic header circuit 130 is coupled to the control circuit 120 to receive the bias control signal pbias. The dynamic header circuit 130 is configured to generate the bias voltage based on the configuration of the bias control signal pbias. The bias voltage is used to bias the oscillation circuit 110, so as to generate the oscillation signal Vosc. In some embodiments, when the lock signal LOCK is outputted, the configuration of the bias control signal pbias is locked, and the bias voltage outputted by the dynamic header circuit 130 is fixed a value corresponding to the locked configuration of the bias control signal pbias. In some embodiments, the dynamic header circuit 130 includes a plurality of transistors 131 to 13n that are controlled by the bias control signal pbias received from the control circuit 120. The gates of the transistors 131 to 13n receives the bias control signal pbias from the control circuit 120. The sources of the transistors 131 to 13n may receive supply power VDD, and the drains of the transistors 131 to 13n are configured to output the bias voltage Vbias.

The transistors 131 to 13n may be weighted differently. In some embodiments, the transistors 131 to 13n are binary-weighted, such that the transistor 131 has a weight coefficient of $2^0$ (or "1"), the transistor 132 has a weight coefficient of $2^1$ (or "2") and the transistor 13n has a weight coefficient of $2^{n-1}$, where n is a positive integer. It is noted that the weight coefficient for each of the transistors 131 to 13n may be set according to design needs. For example, the weight coefficients of the transistors 131 to 13n may be set to $2^0*N$ to $2^{n-1}*N$, where N is a positive integer. In some embodiments, the transistors 131 to 13n weighted according to their transistor sizes. For example, the transistor sizes of the transistors 131 to 13n may be 1×, 2×, 4×, . . . $2^{n-1}$×, respectively. The transistor size refers to at least one of the length or width or ratio of width and length of the transistor. In some embodiments, the transistor sizes refer to the ratio of the width and length (W/L) of the transistors. In an embodiment, the transistors 131 to 13n in the dynamic header circuit 130 are identical in size; and the dynamic header circuit 130 selectively actives transistors among the transistors 131 to 13n according to the bias control signal pbias to generate the bias voltage. In other words, a strength of the dynamic header circuit 130 is determined by a number of activated transistors among the transistors 131 to 13n.

The oscillation detection circuit 140 is configured to detect onset of the oscillation signal Vosc by detecting at least one of a rising edge or a falling edge of the oscillation signal Vosc. For example, when the at least one of the rising edge or the falling edge of the oscillation signal matches a predetermined pattern, the oscillation detection circuit 140 determines that the onset of the oscillation signal Vosc is detected. The oscillation detection circuit 140 outputs the lock signal LOCK upon detection of the onset of the oscillation signal Vosc. The detection of the onset of the oscillation signal Vosc will be described more with reference to FIGS. 2A to 2J.

The switch 150 is coupled between the oscillation detection circuit 140 and the oscillation circuit 110. The switch 150 is configured to couple or decouple the oscillation detection circuit 140 and the oscillation circuit 110 according to the lock signal LOCK. In other words, the switch 150 form or break an electrical path between the oscillation detection circuit 140 and the oscillation circuit 110 based on the locks signal LOCK. In some embodiments, the switch 150 electrically decouples the oscillation detection circuit 140 from the oscillation circuit 110 when the lock signal LOCK is asserted. In this way, the oscillation detection circuit 140 stops receiving the oscillation signal Vosc when lock signal LOCK is outputted.

The latch circuit 160 is coupled to the oscillation circuit 110 to receive the oscillation signal Vosc. When a trigger signal TRI is asserted to the latch circuit 160, the latch circuit 160 performs a latch operation on the oscillation signal Vosc to generate a digitalized random number OUT (also referred to as a random number). In an embodiment, the trigger signal TRI is inputted from an external device. In an alternative embodiment, the trigger signal TRI is generated according to a lock signal LOCK. The trigger signal TRI may be asserted to the latch circuit 160 at the timing when the lock signal LOCK is generated, or may be asserted to the latch circuit 160 after a delay period from the timing when the lock signal LOCK is generated. In some embodiments, the latch circuit 160 is implemented by a D-flip-flop (DFF), but the disclosure is not limited thereto. Any circuit that is capable of performing a latch operation falls within the scope of the disclosure.

In accordance with some embodiments, the lock signal LOCK is outputted upon the detection of the onset of the oscillation signal Vosc. Once the lock signal LOCK is outputted, the control circuit 120 locks the configuration of the bias control signal pbias and the oscillation detection circuit 140 is decoupled from the oscillation circuit 110. In this way, the bias voltage Vbias is self-calibrated to properly bias the oscillation circuit 110. Accordingly, the quality of the digitalized random number generated by the random number generator 100 is improved.

Figure 2A:
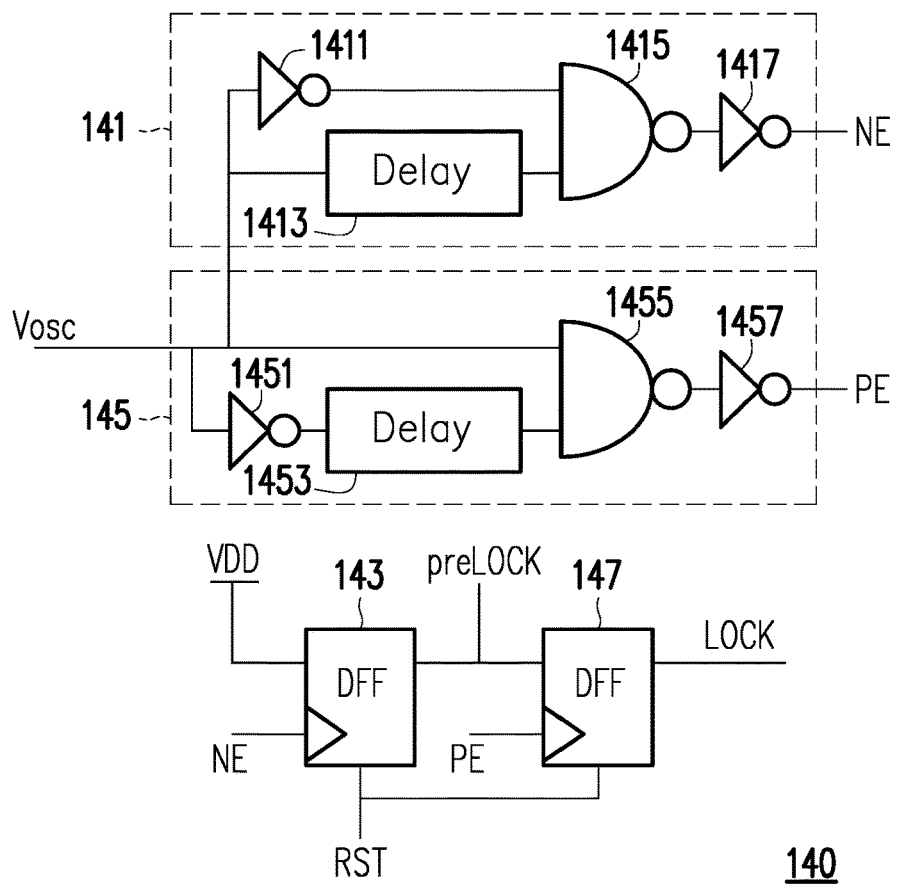
FIGS. 2A to 2J illustrate schematic diagrams of an oscillation detection circuit and waveform diagrams of signals in accordance with some embodiments.

FIG. 2A illustrates a schematic diagram of the oscillation detection circuit 140 in accordance with some embodiments. The oscillation detection circuit 140 may include a falling edge detection circuit 141, a rising edge detection circuit 145, and latching circuits 143 and 147. The falling edge detection circuit 141 is configured to detect a falling edge of the oscillation signal Vosc, and output a detection signal NE when detecting the falling edge on the oscillation signal Vosc. In some embodiments, the detection of the falling edge of the oscillation signal Vosc is indicated by a pulse in the detection signal NE. The rising edge detection circuit 145 is configured to detect a rising edge of the oscillation signal Vosc, and output a detection signal PE when detecting the rising edge on the oscillation signal Vosc. In some embodiments, the detection of the rising edge of the oscillation signal Vosc is indicated by a pulse in the detection signal PE.

The falling edge detection circuit 141 may include logic circuits 1411, 1415, 1417 and a delay circuit 1413. In some embodiments, the logic circuits 1411 and 1417 are NOT logic circuits, and the logic circuit 1415 is NAND logic circuit. The NOT logic circuit 1411 and the delay circuit 1413 are coupled in parallel between the NAND logic circuit 1415 and a terminal that receives the oscillation signal Vosc. The NOT logic circuit 1411 is configured to invert the oscillation signal Vosc to generate an inverted oscillation signal, and the delay circuit 1413 is configured to delay the oscillation signal Vosc to generate a delay oscillation signal. The NAND logic circuit 1415 may performs a NAND operation to the inverted oscillation signal and the oscillation signal. The output of the NAND logic circuit 1415 is inverted by the NOT logic circuit 1417 to generate the detection signal NE.

The latch circuit 143 receives the detection signal NE, and perform a latch operation based on the assertion of the detection signal NE to generate a pre-lock signal preLOCK signal. As such, when a falling edge of the oscillation signal Vosc is detected, the detection signal NE is asserted to the latch circuit 143, and the latch circuit 143 output the pre-lock signal preLOCK signal.

The rising edge detection circuit 145 may include logic circuits 1451, 1455, 1457 and a delay circuit 1453. In some embodiments, the logic circuits 1451 and 1457 are NOT logic circuit, and the logic circuit 1455 is NAND logic circuit. The NOT logic circuit 1451 and the delay circuit 1453 are coupled in series between the NAND logic circuit 1455 and a terminal that receives the oscillation signal Vosc. The NOT logic circuit 1451 is configured to invert the oscillation signal Vosc to generate an inverted oscillation signal, and the delay circuit 1453 is configured to delay the inverted oscillation signal to generate a delay signal of the inverted oscillation signal. The NAND logic circuit 1455 receives the oscillation signal Vosc and the delay signal of the inverted oscillation signal as inputted signals, and performs a NAND operation on the inputted signals. The output of the NAND logic circuit 1455 is inverted by the NOT logic circuit 1457 to generate the detection signal PE. The schematic diagrams of the falling edge detection circuit 141 and the rising edge detection circuit 145 in FIG. 2A are for illustration purpose only. Any circuit that is capable of detecting falling edge or rising edge of an oscillation signal falls within the scope of the disclosure.

The latch circuit 147 is coupled in series to the latch circuit 143, in which an output of the latch circuit 143 is coupled to an input of the latch circuit 147. The latch circuit 147 receives the detection signal PE from the rising edge detection circuit 145 and pre-lock signal preLOCK signal from the latch circuit 143. The latch circuit 147 latches the pre-lock signal preLOCK signal based on the assertion of the detection signal PE to generate the lock signal LOCK. As such, when a falling edge followed by a rising edge is detected, the lock signal LOCK is outputted by the oscillation detection circuit 140. In some embodiments, the latch circuits 143 and 147 are implemented using DFFs, but the disclosure is not limited thereto.

Figure 2B:
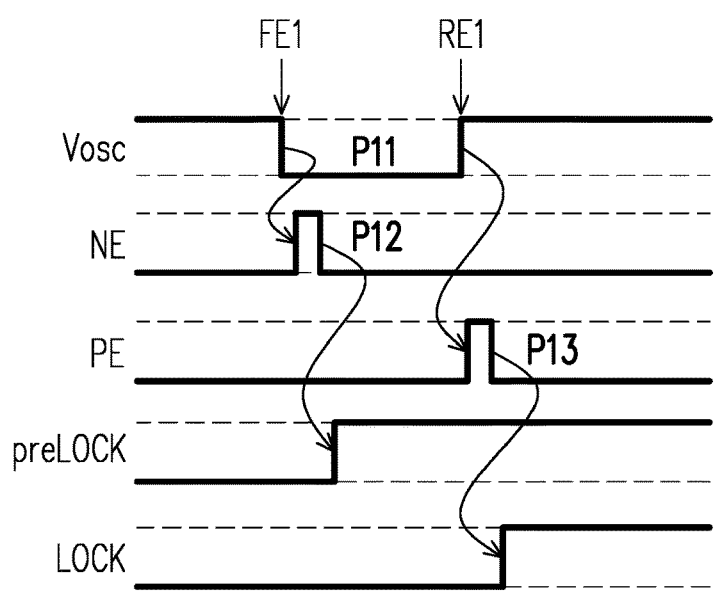

FIG. 2B illustrates a waveform diagram of oscillation signal Vosc, detection signals NE, PE, and pre-lock signal preLOCK signal and the lock signal LOCK in accordance with some embodiments. The oscillation signal Vosc has a falling edge FE1 followed by a rising edge RE1 to form a negative pulse P11 on the oscillation signal Vosc. Referring to FIGS. 2A and 2B, the falling edge detection circuit 141 outputs the detection signal NE with the positive pulse P12, when the falling edge FE1 of the oscillation signal Vosc is detected. Next, the latch circuit 143 is triggered by the detection signal NE to generate the pre-lock signal preLOCK signal as indicated by the transition from "low" to "high" in FIG. 2B. Similarly, the rising edge detection circuit 145 outputs the detection signal PE with the positive pulse P13, when the rising edge RE1 of the oscillation signal Vosc is detected. Next, the latch circuit 147 is triggered by the detection signal PE and to latch the pre-lock signal preLOCK signal to generate the lock signal LOCK as indicated in FIG. 2B. In this way, the oscillation detection circuit 140 as illustrated in FIG. 2A may detect the pair of the falling edge and the rising edge, in which the falling edge is followed by the rising edge.

Figure 2C:
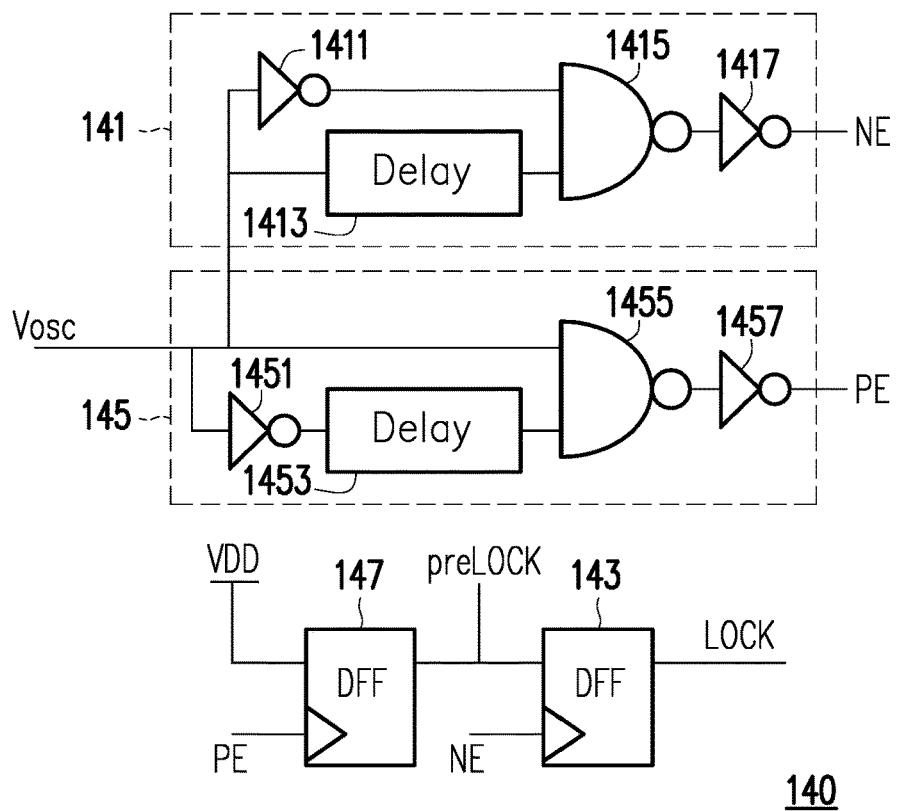

FIG. 2C illustrates a schematic diagram of the oscillation detection circuit 140 in accordance with some embodiments. The same elements shown in FIGS. 2C and 2A are illustrated with same reference numbers. A difference between the oscillation detection circuit illustrated in FIG. 2C and the oscillation detection circuit illustrated in FIG. 2A is the swap in position of the latch circuits 143 and 147. In FIG. 2A, an output terminal of the latch circuit 143 is coupled to an input terminal of the latch circuit 147. In FIG. 2B, the output terminal of the latch circuit 147 is coupled to the input terminal of the latch circuit 143. As such, the oscillation detection circuit 140 as illustrated in FIG. 2A may output the lock signal LOCK upon the detection of the rising edge followed by the falling edge.

Figure 2D:
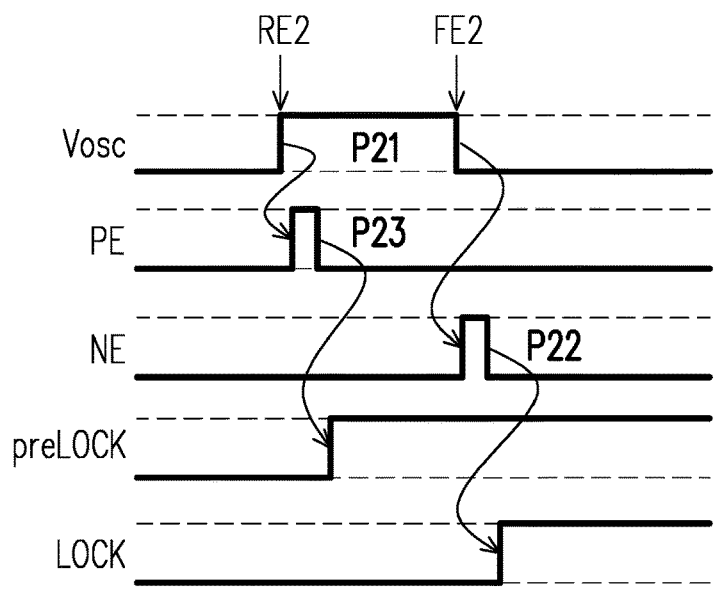

Referring to waveform diagram shown in FIG. 2D, the oscillation signal Vosc has a rising edge RE2 followed by a falling edge FE2 to form a positive pulse P21 on the oscillation signal Vosc. The rising edge detection circuit 145 outputs the detection signal PE with the positive pulse P23, when the rising edge RE2 of the oscillation signal Vosc is detected. Next, the latch circuit 147 is triggered by the detection signal PE to generate the pre-lock signal preLOCK signal as indicated by the transition from "low" to "high" in FIG. 2D. The falling edge detection circuit 141 outputs the detection signal NE with the positive pulse P22, when the falling edge FE2 of the oscillation signal Vosc is detected. Next, the latch circuit 143 is triggered by the detection signal NE to latch the pre-lock signal preLOCK signal to generate the lock signal LOCK as indicated in FIG. 2D. In this way, the oscillation detection circuit 140 as illustrated in FIG. 2C may output the lock signal LOCK upon the detection of the rising edge followed by the falling edge.

Figure 2E:
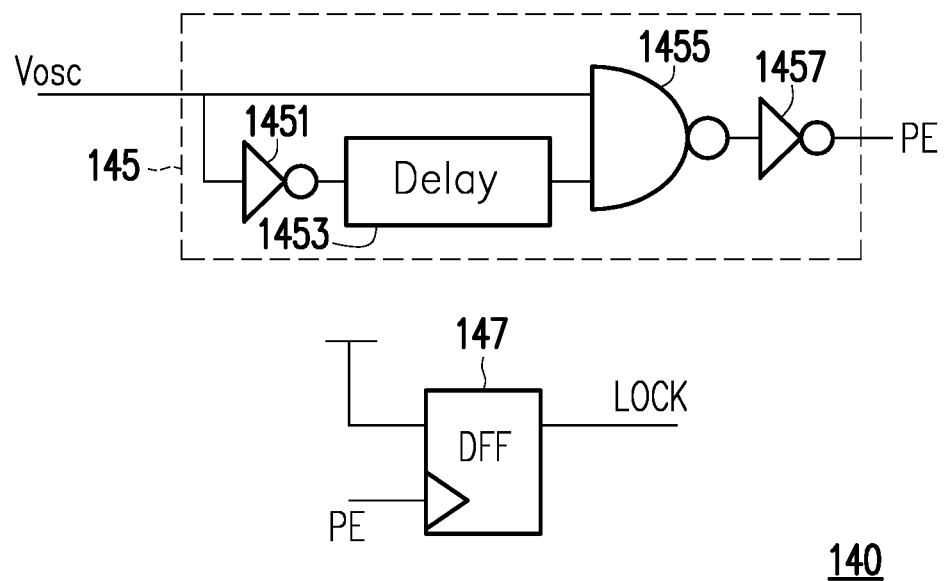

FIG. 2E illustrates a schematic diagram of the oscillation detection circuit 140 in accordance with some embodiments. The same elements shown in FIGS. 2E and 2A are illustrated with same reference numbers. A difference between the oscillation detection circuit illustrated in FIG. 2E and the oscillation detection circuit illustrated in FIG. 2A is that oscillation detection circuit illustrated in FIG. 2E output the lock signal LOCK based on detection of the rising edge only. Referring to FIG. 2E, the oscillation detection circuit 140 includes the rising edge detection circuit 145 and the latch 147. The detailed description regarding the rising edge detection circuit 145 and the latch circuit 147 may be referred to above description with reference to FIG. 2A.

Figure 2F:
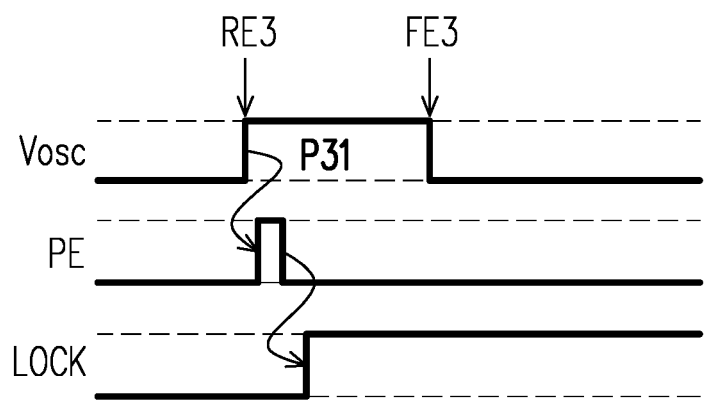

Referring to FIGS. 2E and 2F, the oscillation signal Vosc may include a positive pulses P31 formed by a rising edge RE3 and a falling edge FE3. When the rising edge RE3 of the oscillation signal Vosc is detected by the rising edge detection circuit 145, the rising edge detection circuit 145 outputs the detection signal PE that triggers the latch circuit 147 to generate the lock signal LOCK. As such, the oscillation detection circuit 140 as illustrated in FIG. 2E may output the lock signal LOCK upon the detection of the rising edge in the oscillation signal Vosc.

Figure 2G:
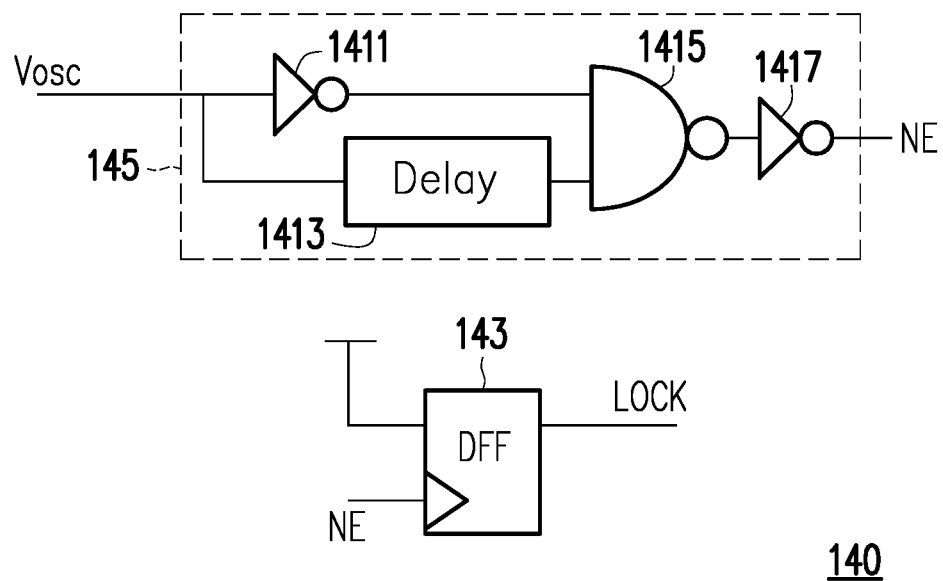

FIG. 2G illustrates a schematic diagram of the oscillation detection circuit 140 in accordance with some embodiments. A difference between the oscillation detection circuit illustrated in FIG. 2G and the oscillation detection circuit illustrated in FIG. 2A is that oscillation detection circuit illustrated in FIG. 2G output the lock signal LOCK based on detection of the falling edge only. Referring to FIG. 2G, the oscillation detection circuit 140 includes the falling edge detection circuit 141 and the latch 143. The detailed description regarding the rising edge detection circuit 141 and the latch circuit 143 may be referred to the above description with reference to FIG. 2A.

Figure 2H:
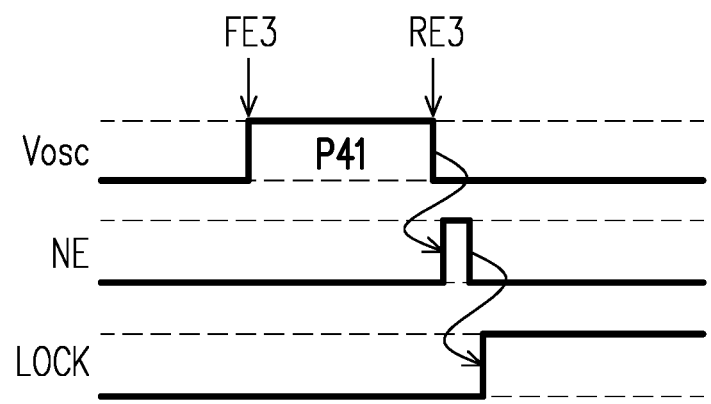

Referring to FIGS. 2G and 2H, the oscillation signal Vosc may include a positive pulses P41 formed by a rising edge RE4 and a falling edge FE4. When the falling edge FE4 of the oscillation signal Vosc is detected by the falling edge detection circuit 141, the falling edge detection circuit 141 outputs the detection signal NE that triggers the latch circuit 143 to generate the lock signal LOCK. As such, the oscillation detection circuit 140 as illustrated in FIG. 2G may output the lock signal LOCK upon the detection of the falling edge in the oscillation signal Vosc.

Figure 2I:
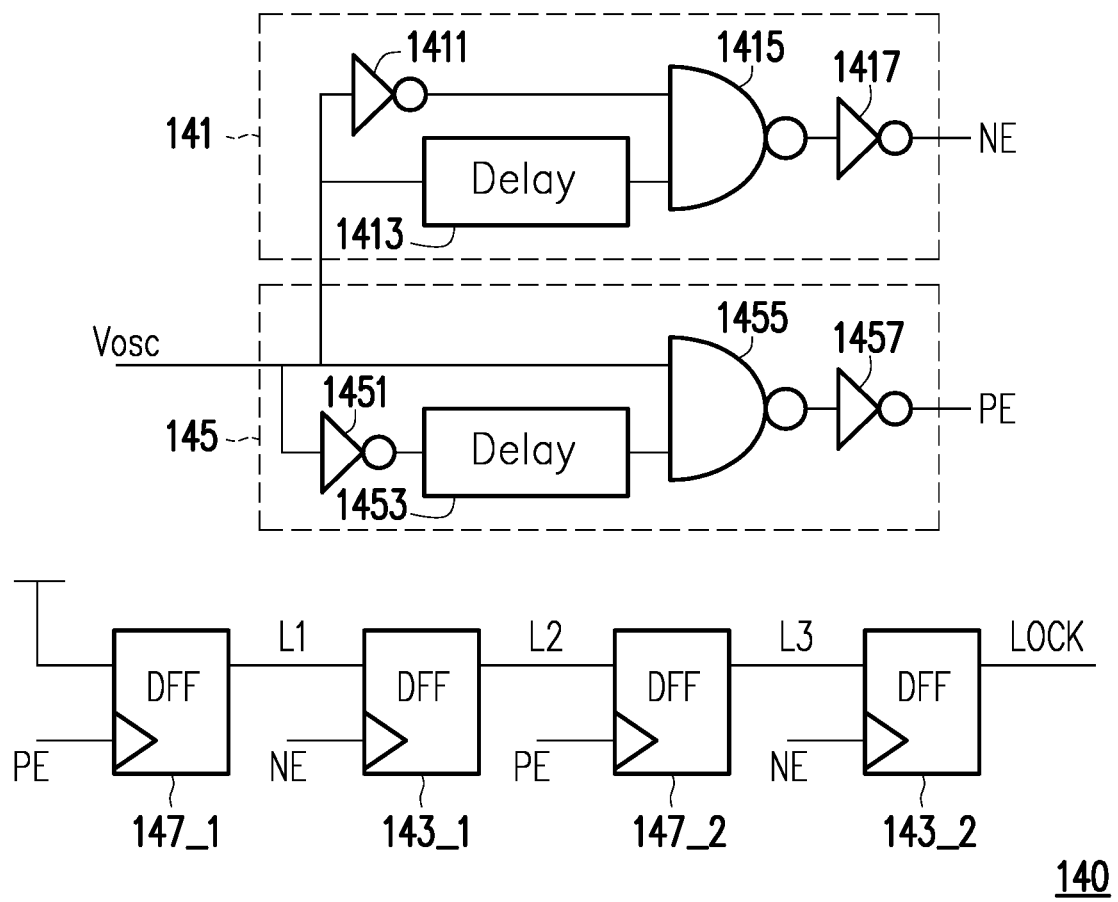

FIG. 2I illustrates a schematic diagram of the oscillation detection circuit 140 in accordance with some embodiments. A difference between the oscillation detection circuit illustrated in FIG. 2I and the oscillation detection circuit illustrated in FIG. 2A is that oscillation detection circuit illustrated in FIG. 2I is configured to output the lock signal LOCK upon a detection of multiple pairs of rising edge and falling edge. The oscillation detection circuit 140 illustrated in FIG. 2I includes the falling edge detection circuit 141 and a rising edge detection circuit 145. The detailed description about the falling edge detection circuit 141 and a rising edge detection circuit 145 may be referred to the above description with reference to FIG. 2A. The oscillation detection circuit 140 illustrated in FIG. 2I further includes latch circuits 143_1, 143_2, 147_1 and 147_2 coupled in series, in which the latch circuits are triggered by the detection signal NE, and the latch circuits 147_1 and 147_2 are triggered by the detection signal PE. The latch circuit 147_1 may perform a latch operation according to the detection signal PE to generate a pre-lock signal L1. The latch circuit 143_1 may latch the pre-lock signal L1 according to the detection signal NE to generate a pre-lock signal L2; the latch circuit 147_2 may latch the pre-lock signal L2 according to the detection signal PE to generate a pre-lock signal L3; and the latch circuit 143_2 may latch the pre-lock signal L3 according to the detection signal NE to generate the lock signal LOCK.

Figure 2J:
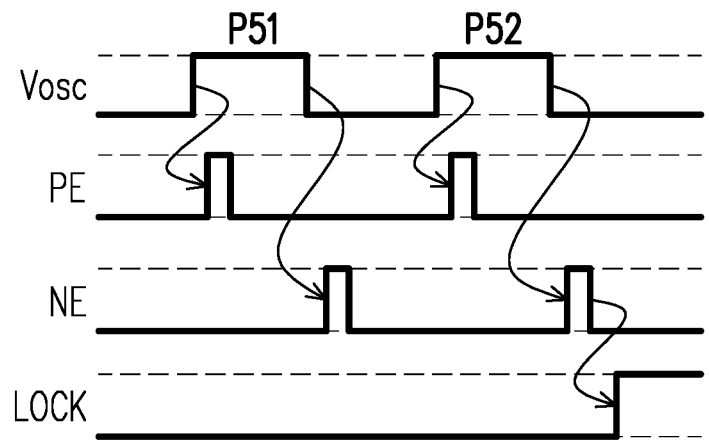

Referring to FIGS. 2I and 2J, the oscillation signal Vosc may include pulses P51 and P52, where each of the pulse P51 and P52 is formed by a pair of rising edge and falling edges. Upon the detection of the rising edge and falling edge of the pulse P51 of the oscillation signal Vosc, the rising edge detection signal 145 and the falling edge detection circuit 141 outputs a first pulse on the detection signals PE and NE, respectively. The first pulses in the detection signals PE and NE are used to trigger the latching operations of the latch circuit 147_1 and 143_1, respectively. Upon the detection of the rising edge and falling edge of the pulse P52 of the oscillation signal Vosc, the rising edge detection signal 145 and the falling edge detection circuit 141 outputs a second pulse on the detection signals PE and NE, respectively. The second pulses in the detection signals PE and NE are used to trigger the latching operations of the latch circuit 147_2 and 143_2, respectively. In this way, the oscillation detection circuit 140 illustrated in FIG. 2I may output the lock signal LOCK upon the detections of multiple pairs of rising edge and falling edge on the oscillation signal Vosc. It is noted that number of latch circuits and arrangement of the latch circuits are not limited to what is shown in FIG. 2I. For example, the positions of the latch circuits 147_1 and 147_2 may be swapped to the positions of the latch circuits 143_1 and 143_2. In addition, the number of the latch circuits may more or less based on the design needs.

Figure 3:
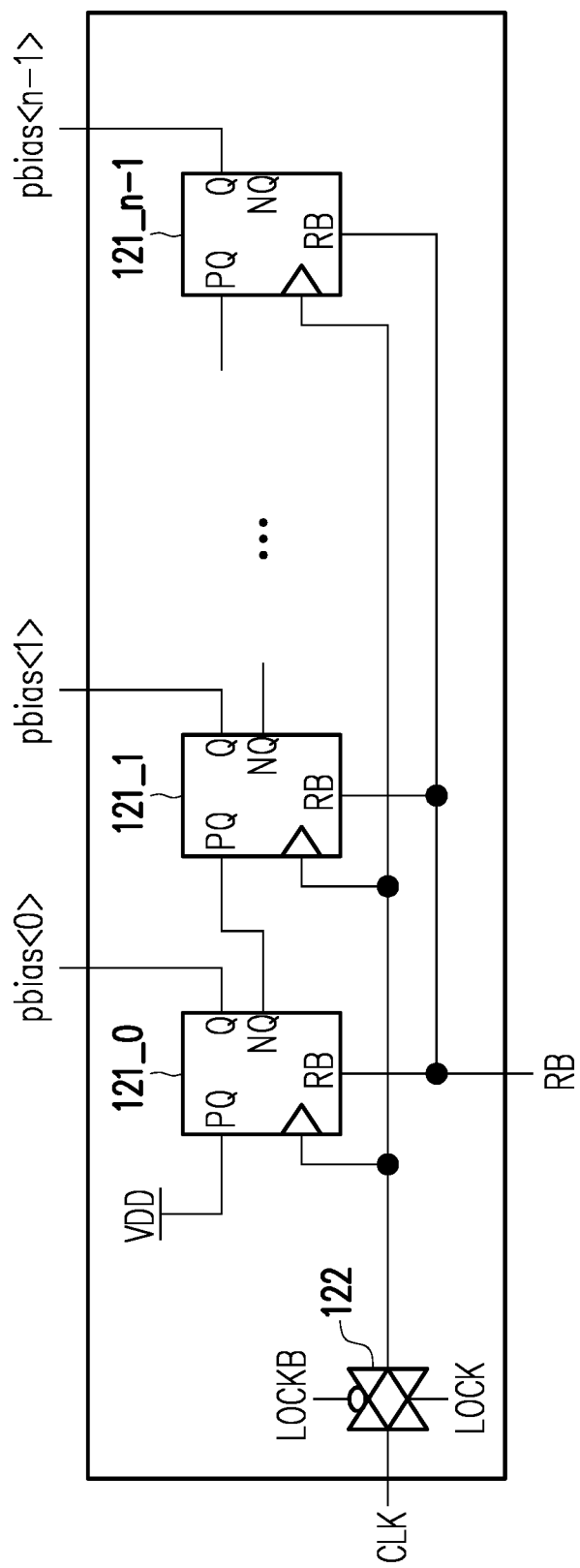
FIG. 3 illustrates a schematic diagram of a control circuit in accordance with some embodiments.

FIG. 3 illustrates a schematic diagram of a control circuit 120 in accordance with some embodiments. The control circuit 120 includes a plurality of counter circuits 121_0 through 121_n−1 coupled in series, in which each of the counter circuits 121_0 through 121_n-1 is configured to generate a bit value of the bias control signal pbias. For example, the counter circuit 121_0 is configured to generate the bit pbias<0>, and the counter circuit 121_n-1 is configured to generate the bit pbias<n-1>. The control circuit 120 may receive an inverted reset signal RB, and configured to reset the counter circuits 121_0 through 121_n-1 when the inverted reset signal RB is asserted to the control circuit 120. In some embodiments, the inverted reset signal RB is the inverted signal of the reset signal RST shown in FIG. 1.

The control circuit 120 may include a clock input terminal that receives the clock signal CLK from outside of the control circuit 120. The control circuit 120 may further include a switch 122 that is coupled between the counter circuits 121_0 through 121_n-1 and the clock input terminal. In some embodiments, the switch 122 is controlled by the lock signal LOCK and the inverted lock signal LOCKB, to couple or decouple the input clock terminal and the counter circuits 121_0 through 121_n-1. When the lock signal LOCK has not been asserted to the control circuit 120, the switch 122 couples the input clock terminal to the counter circuits 121_0 through 121_n-1. As such, the counter circuits 121_0 through 121_n-1 generate the bias control signal pbias based on the clock signal CLK. When the lock signal LOCK is asserted to the control circuit 120, the switch 122 decouples the clock input terminal from the counter circuits 121_0 through 121_n-1. Accordingly, the outputs of the counter circuits 121_0 through 121_n-1 are kept unchanged, and the configuration of the bias control signal pbias is locked.

Figure 5:
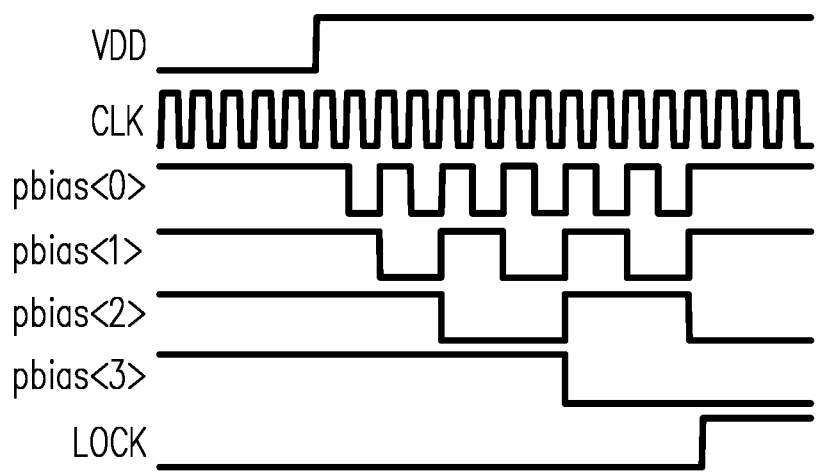
FIG. 5 illustrates a waveform diagram of signals in a random number generator in accordance with some embodiments.

FIG. 5 shows a waveform diagram of a 4-bit bias control signal pbias, the lock signal LOCK, the clock signal CLK and supply power VDD in accordance with some embodiments. Referring to FIG. 3 and FIG. 5, when the supply power VDD and the clock signal CLK are asserted to the control circuit 120, the counter circuits of the control circuit 120 generates bits pbias<0> through pbias<3>, respectively. As shown in FIG. 5, the bits pbias<0> through pbias<3> are oscillating signals with different cycles. For example, the cycle of bit pbias<1> is longer than the cycle of the bit pbias<0>; the cycle of the bit pbias<2> is longer than the cycle of the bit pbias<1>; and the cycle of bit pbias<3> is longer than the cycle of the bit pbias<2>. Referring to FIGS. 3 and 5, when the lock signal LOCK is asserted, the bits pbias<0> through pbias<3> are locked to values at the timing when the lock signal LOCK is asserted. As shown in FIG. 5, the bits pbias<0> and pbias<1> are locked to logic value of "1", and the bits pbias<2> and pbias<3> are locked to logic value of 0 at the timing when the lock signal LOCK is asserted.

Figure 4:
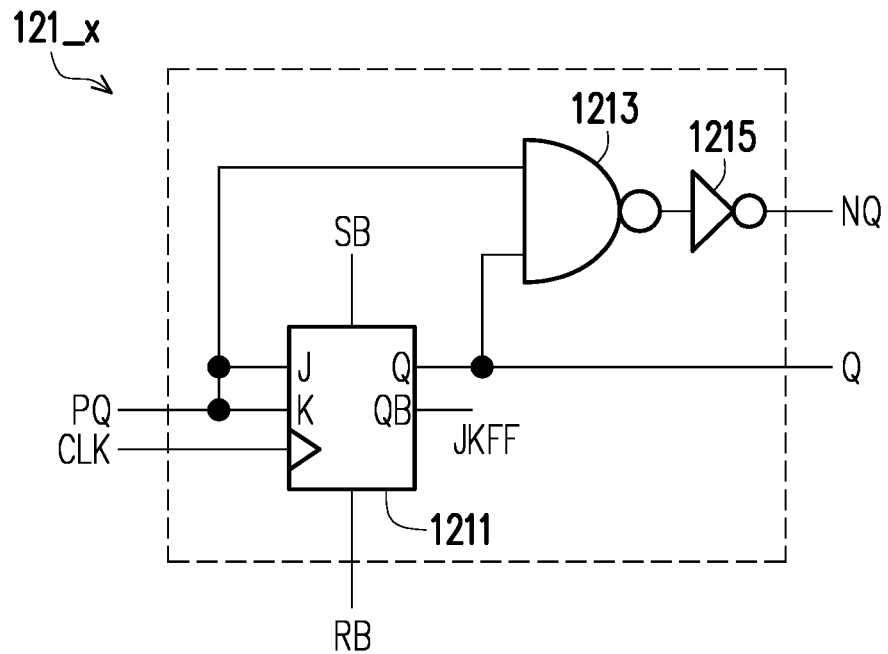
FIG. 4 illustrates schematic diagram of a counter circuit included in a control circuit in accordance with some embodiments.

FIG. 4 illustrates a schematic diagram of a counter circuit 121_x in accordance with some embodiments. The counter circuit 121_x could be any one of the counter circuits 121_0 through 121_n-1 shown in FIG. 3. The counter circuit 121_x may include a flip-flop circuit 1211 and logic circuits 1213 and 1215. In some embodiments, the flip-flop circuit 1211 is a JK flip-flop (JKFF), the logic circuit 1213 is a NAND logic circuit, and the logic circuit 1215 is a NOT logic circuit. The structure of the JK flip-flop, the NAND logic circuit and the NOT logic circuit are well-known in the relevant field, thus the detailed description about these components are omitted hereafter.

In some embodiments, an input terminal of the NAND logic circuit 1213 is coupled to the output terminal Q of the JKFF, and another input terminal of the NAND logic circuit 1213 is coupled to the input terminals J and K of the JKFF. The output of the NAND logic gate is inputted to the NOT logic circuit, and the output of the NOT logic circuit serves as an output terminal NQ of the counter circuit 121_x. In addition, the output terminal Q of the JKFF serves as the output terminal Q of counter circuit 121_x. Each of the bit pbias<0> through pbias<n-1> is outputted from the output terminal Q of the respective counter circuit of the control circuit 120.

Figure 6:
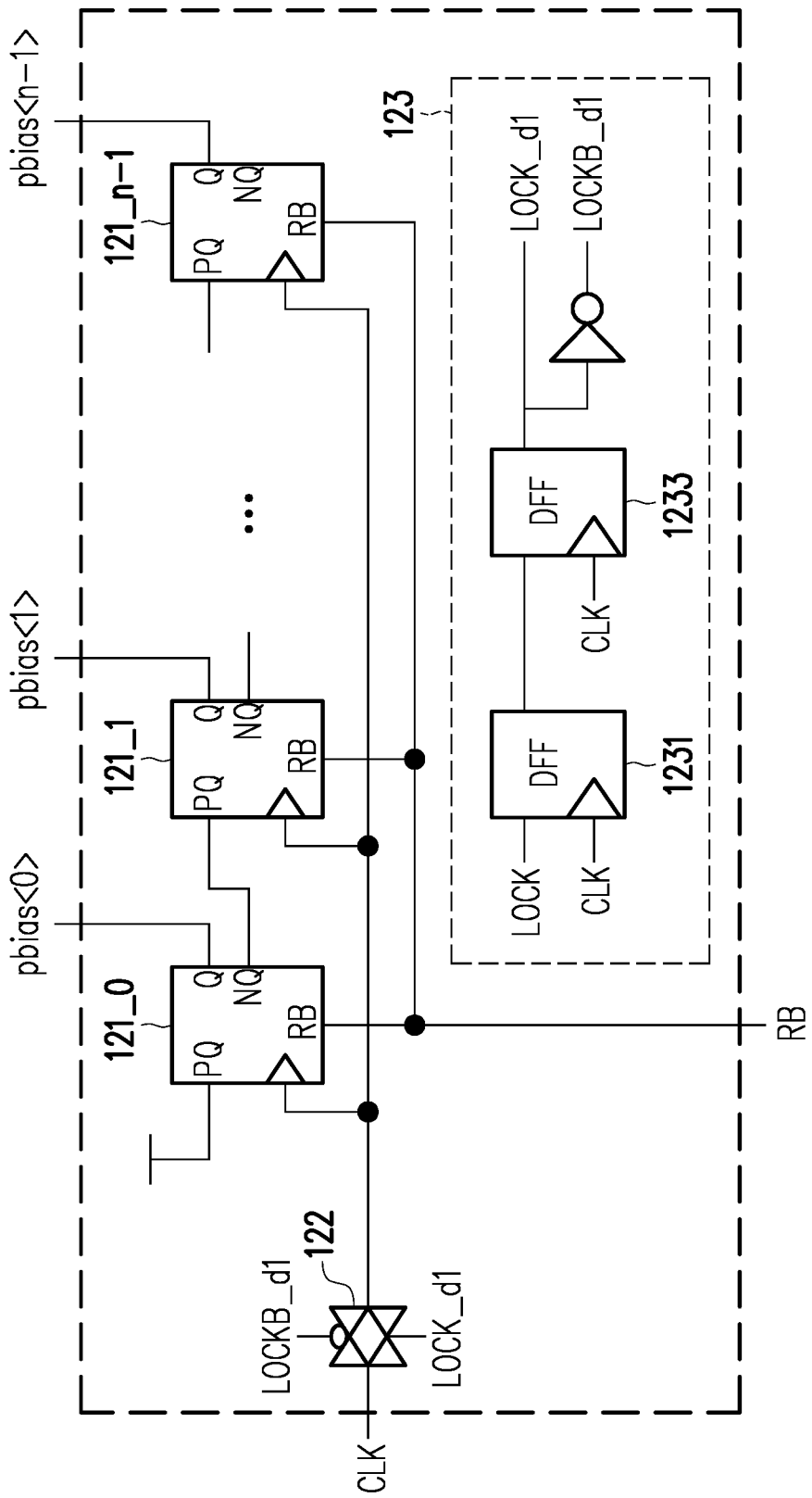
FIG. 6 illustrates a schematic diagram of a control circuit in a random number generator in accordance with some embodiments.

FIG. 6 illustrates a schematic diagram of a control circuit 120 in accordance with some embodiments. A difference between the control circuit illustrated in FIG. 6 and the control circuit illustrated in FIG. 3 is that the control circuit illustrated in FIG. 6 further includes a delay circuit 123. The delay circuit 123 receives the lock signal LOCK and the clock signal CLK, and configured to delay the lock signal LOCK to generate delay lock signals LOCK_d1 and LOCKB_d1. In some embodiments, the delay circuit 123 include at least one delay elements 1231 and 1233 that are configured to delay the lock signal LOCK for a delay period. A number of the delay element and the designs of the delay elements are determined according to the design needs. The delay element 1233 may output the delay lock signal LOCK_d1. In addition, the delay circuit 123 comprises a NOT logic circuit that is coupled to the output of the 1233 to generate the delay lock signal LOCKB_d1.

Another difference between the between the control circuit illustrated in FIG. 6 and the control circuit illustrated in FIG. 3 is that the switch 122 of the control circuit in FIG. 6 is controlled by the delay lock signals LOCK_d1 and LOCKB_d1. The delay lock signals LOCK_d1 and LOCKB_d1 generated by the delay circuit 123 is provided to the switch 122 to control the switching operation of the switch 122. In this way, the control circuit 120 does not lock the configuration of the bias control signal pbias immediately after the lock signal LOCK is generated. Instead, the control circuit 120 locks the configuration of the bias control signal pbias after a delay period from the assertion of the lock signal LOCK. Because the oscillation of the oscillation signal Vosc may be more stable after the delay period from the onset of the oscillation signal Vosc, the quality of the generated random number is better when the configuration of the bias control signal is locked after the delay period.

Figure 7:
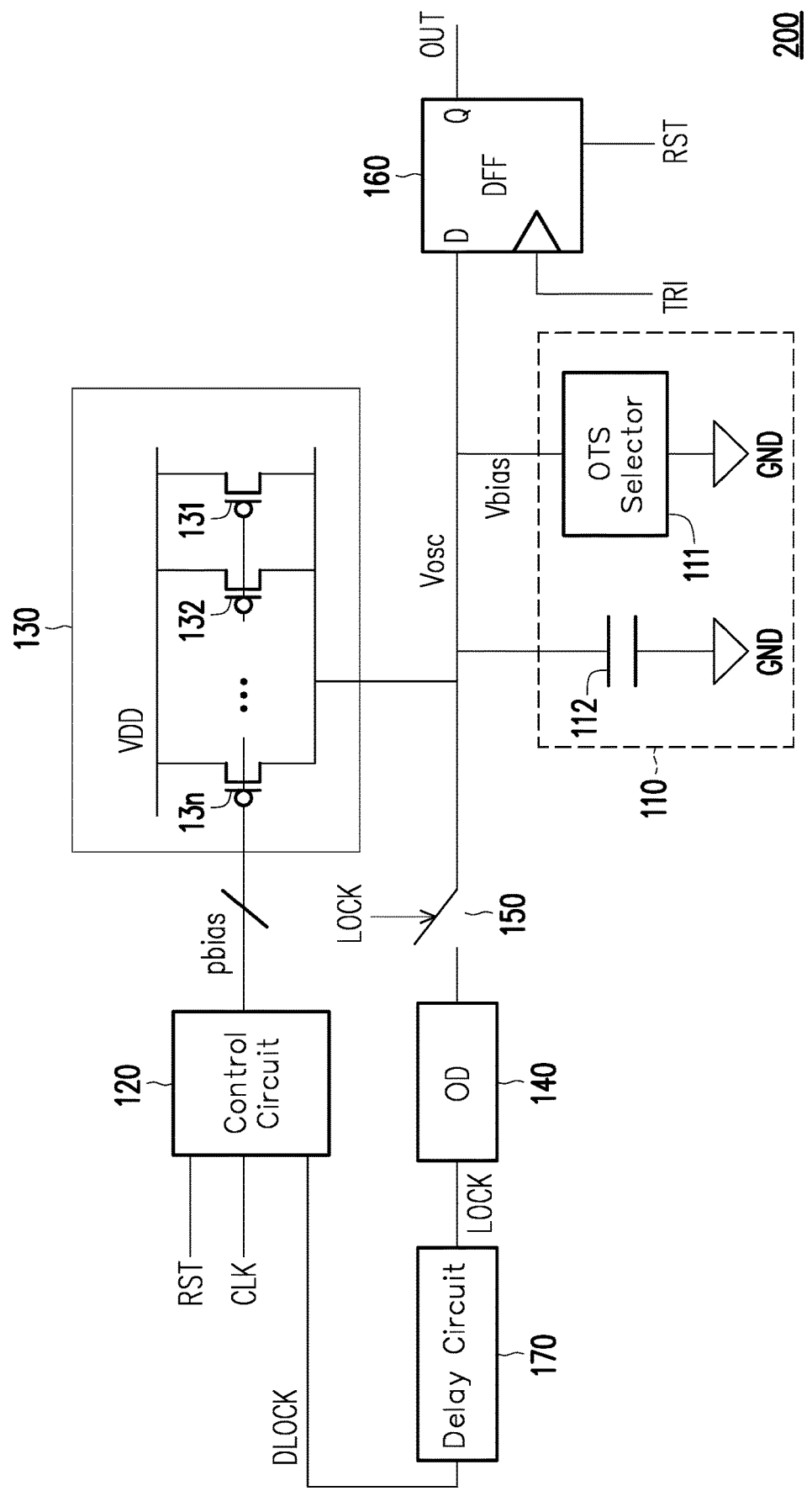
FIGS. 7 to 9 illustrate schematic diagrams of a random number generator in accordance with some alternative embodiments.

FIG. 7 illustrates a schematic diagram of a random number generator 200 in accordance with some embodiments. A difference between the random number generator 200 illustrated in FIG. 7 and the random number generator 100 illustrated in FIG. 1 is that the random number generator 200 further includes a delay circuit 170 that is coupled between the oscillation detection circuit 140 and the control circuit 120. The delay circuit 170 receives the lock signal LOCK from the oscillation detection circuit 140, and delays the lock signal LOCK for a delay period to generate the delay lock signal DLOCK. The disclosure does not intend to limits structure of the delay circuit 170. Any circuit that is capable of delay a signal falls within the scope of the disclosure. The delay lock signal DLOCK is provided to the control circuit 120 to lock the configuration of the bias control signal pbias. In other words, the control circuit 120 of the random number generator 200 locks the configuration of the bias control signal pbias based on the delay lock signal DLOCK. Because the oscillation of the oscillation signal Vosc may be more stable after a delay period from the onset of the oscillation signal Vosc, the quality of the generated random number is better when the configuration of the bias control signal is locked after the delay period.

Figure 8:
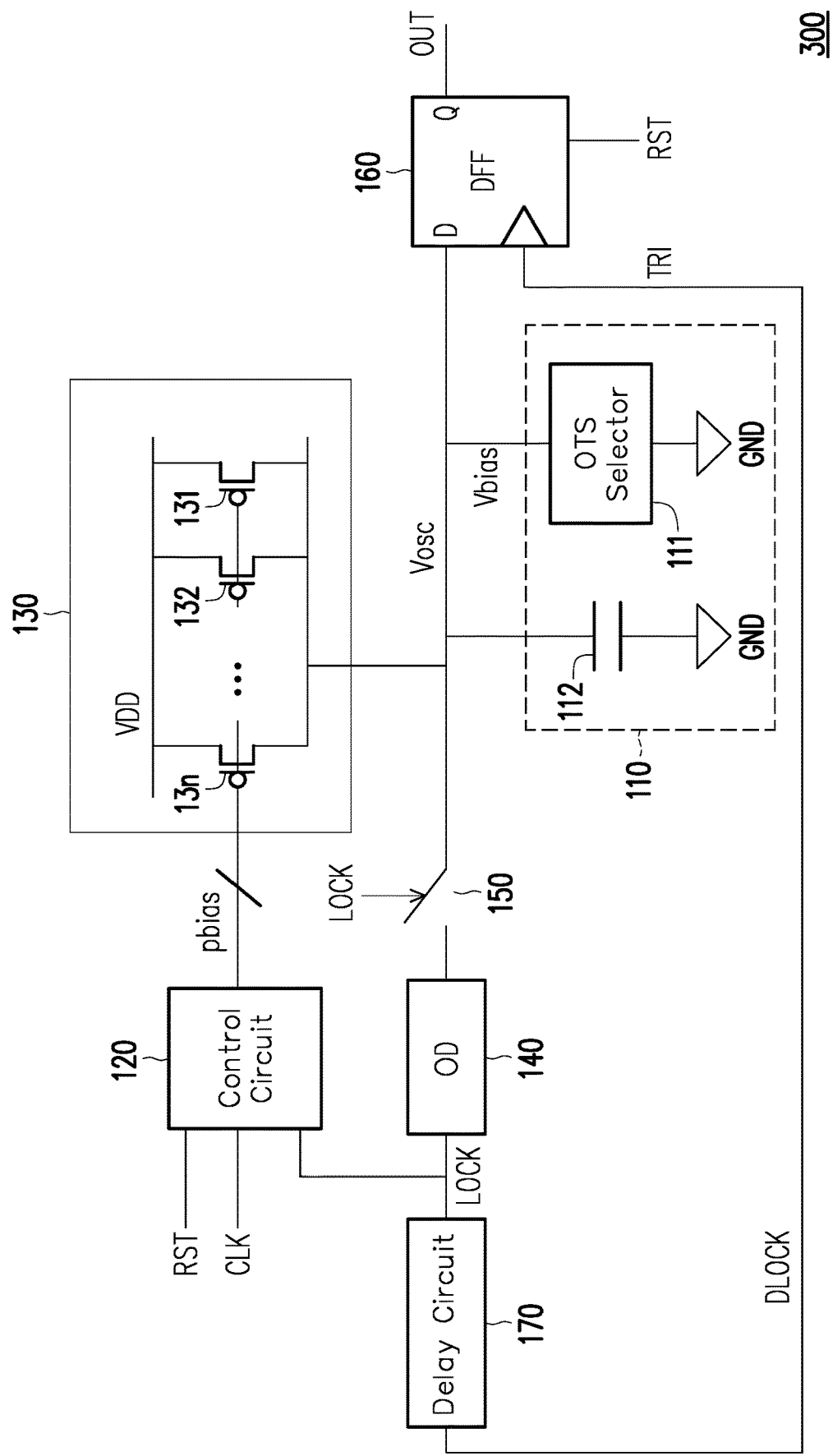

FIG. 8 illustrates a schematic diagram of a random number generator 300 in accordance with some embodiments. A difference between the random number generator 300 illustrated in FIG. 8 and the random number generator 100 illustrated in FIG. 1 is that the random number generator 300 further includes a delay circuit 170 that is coupled between the oscillation detection circuit 140 and the latch circuit 160. The delay circuit 170 receives the lock signal LOCK from the oscillation detection circuit 140, and delays the lock signal LOCK for a delay period to generate the delay lock signal DLOCK. The delay lock signal DLOCK is provided as the trigger signal TRI to the latch circuit 160. As such, the latch circuit 160 latches the oscillation signal Vosc based on the delay lock signal DLOCK. In other words, the latch circuit 160 latches the oscillation signal Vosc after the delay period from the onset of the oscillation signal Vosc.

Figure 9:
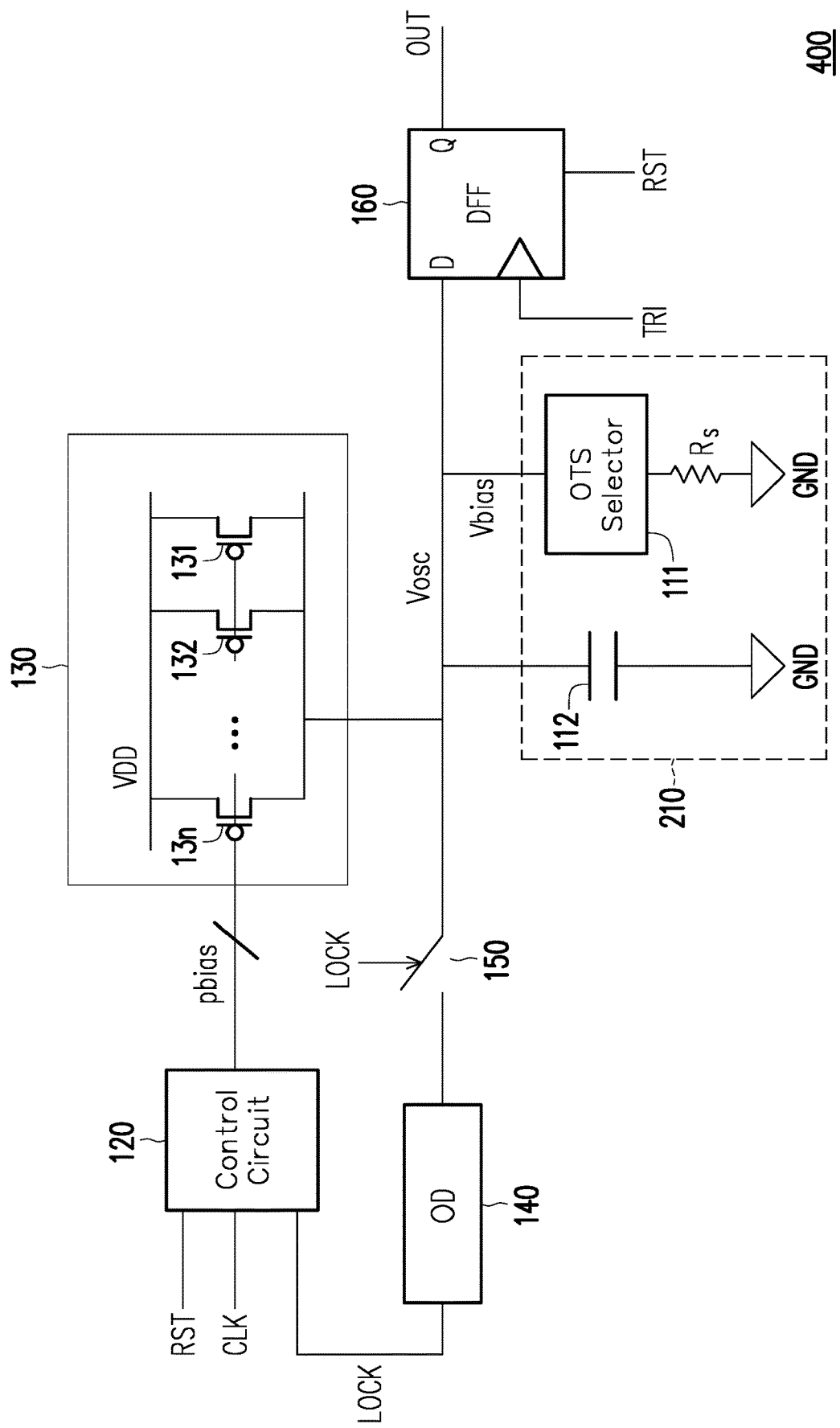

FIG. 9 illustrates a schematic diagram of a random number generator 400 in accordance with some embodiments. A difference between the random number generator 400 illustrated in FIG. 9 and the random number generator 100 illustrated in FIG. 1 is that an oscillation circuit 210 of the random number generator 400 further includes a resistor Rs coupled in series to the selector 111. The resistor Rs may be coupled between the selector 111 and the reference terminal GND, but the disclosure is not limited thereto. The resistor Rs is configured to clamp a peak transient current flowing through the selector 111 during operation of the oscillation circuit 210. The resistor Rs may increase discharging time of the load capacitor 112, thereby reducing the peak transient current flowing through the selector 111. For example, when the resistor Rs is coupled in series to the selector 111, a resistance of the discharging path (forming through the load capacitor 112, the selector 111, the resistor Rs and the reference terminal GND) increases. As a result, the discharging time of the load capacitor 112 during the discharging operation increases, and the current flowing through the selector 111 is lower compared to the embodiment where the resistor is not included. The IV curve 103 of the selector 111 that is coupled in series to the resistor Rs in the oscillation circuit 210 is illustrated in FIG. 10. In this way, the oscillation circuit 210 of the random number generator 400 is protected against the transient current occurred during operation of the oscillation circuit 210, and a reliability of the oscillation circuit 210 is improved.

Figure 11:
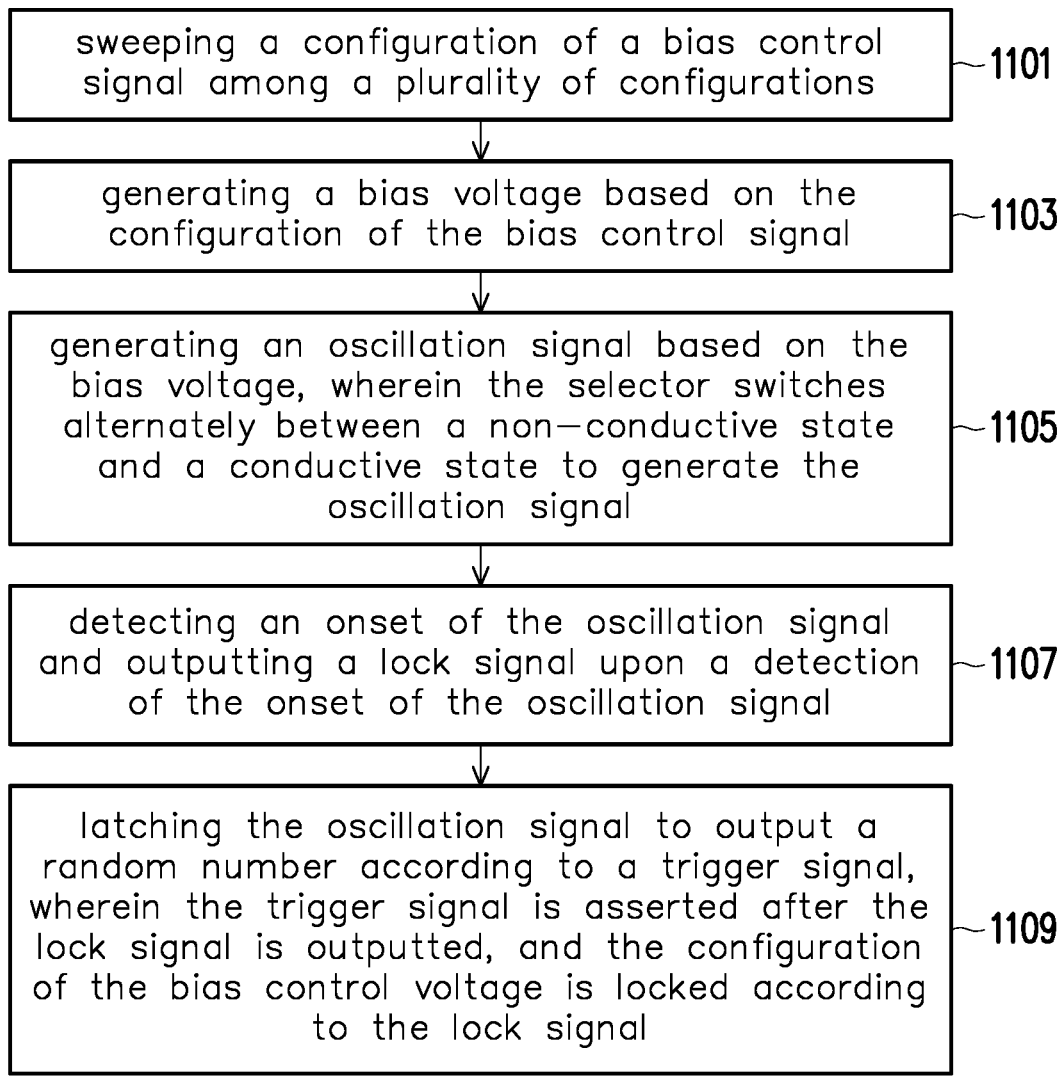
FIG. 11 illustrates a flowchart diagram of a method of generating a random number in accordance with some embodiments.

FIG. 11 illustrates a flowchart diagram of a method for generating a random number in accordance with some embodiments. In block 1101, a configuration of a bias control signal is swept among a plurality of configurations of the bias control signal. In block 1103, a bias voltage is generated based on the bias control signal. In block 1105, an oscillation signal is generated based on the bias voltage and an operation state of a selector. The selector switches alternately between a conductive state and a non-conductive state to generate the oscillation signal. In block 1107, an onset of the oscillation signal is detected and a lock signal is outputted upon a detection of the onset of the oscillation signal. In block 1109, the oscillation signal is latched to output a random number according to a trigger signal, wherein the trigger signal is asserted after the lock signal is outputted, and the configuration of the bias control voltage is locked according to the lock signal.

Figure 12:
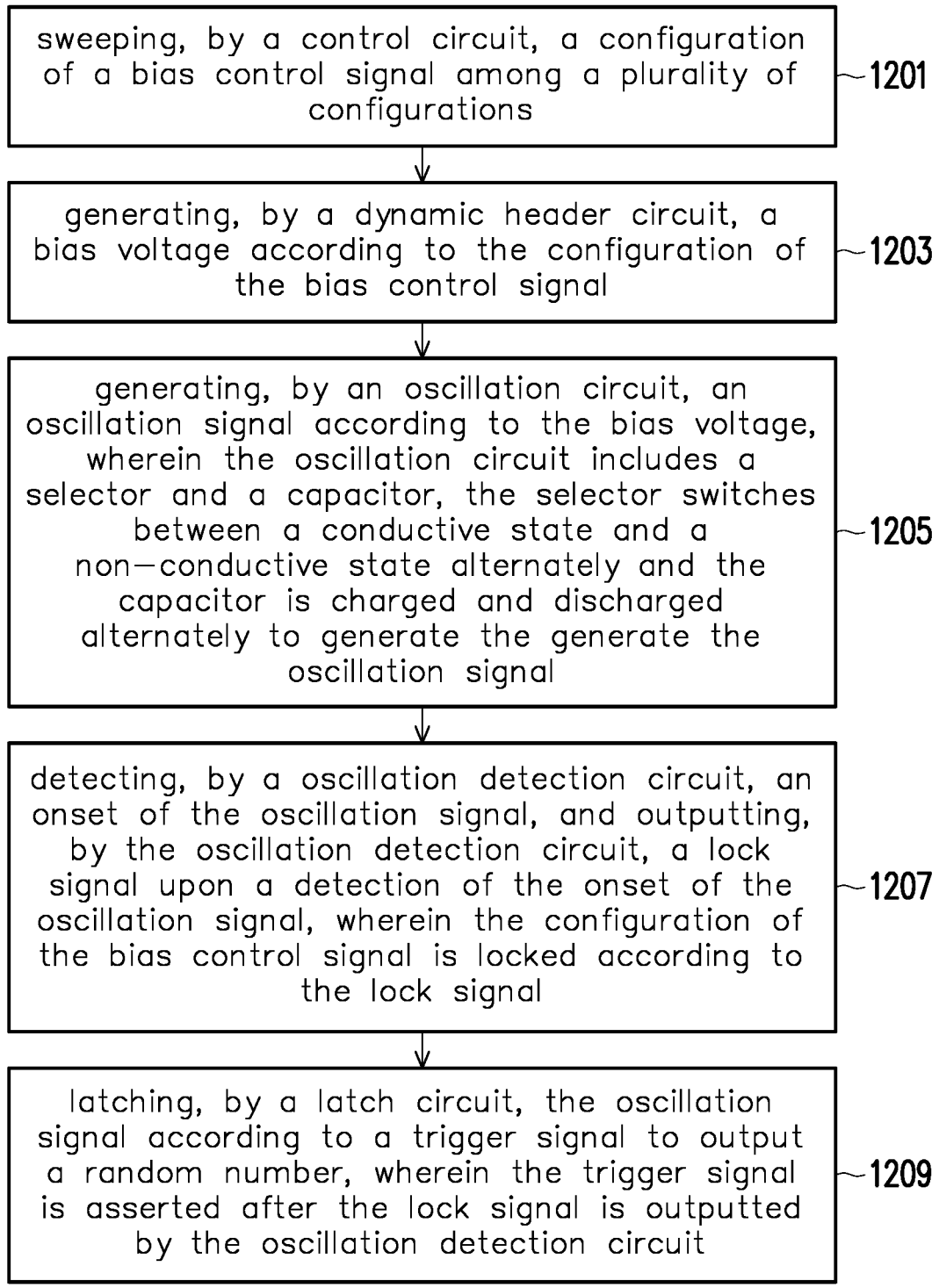
FIG. 12 illustrates a flowchart diagram of an operation method of a random number generator in accordance with some embodiments.

FIG. 12 illustrates a flowchart diagram of an operation method of a random number generator (i.e., random number generator 100 in FIG. 1) in accordance with some embodiments. The random number generator may include an oscillation circuit, a control circuit, a dynamic header circuit, an oscillation detection circuit and a latch circuit. In block 1201, the control circuit of the random number generator sweeps a configuration of a bias control signal among a plurality of configurations. In block 1203, the dynamic header circuit that is coupled to the control circuit, generates a bias voltage according to the bias control signal. In block 1205, the oscillation circuit generates an oscillation signal according to the bias voltage, wherein the oscillation circuit includes a selector and a capacitor, the selector switches between a conductive state and a non-conductive state alternately and the capacitor is charged and discharged alternately to generate the oscillation signal. In block 1207, the oscillation detection circuit detects an onset of the oscillation signal, and outputs a lock signal upon a detection of the onset of the oscillation signal. The configuration of the bias control signal is locked according to the lock signal. In block 1209, the latch circuit latches the oscillation signal according to a trigger signal to output a random number. The trigger signal is asserted after the lock signal is outputted by the oscillation detection circuit.

In accordance with some embodiments, a random number generator that includes a control circuit, an oscillation circuit, a dynamic header circuit, an oscillation detection circuit and a latch circuit is introduced. The control circuit sweeps a configuration of a bias control signal among a plurality of configurations. The dynamic header circuit generates a bias voltage based on the configuration of the bias control signal. The oscillation circuit generates an oscillation signal based on the bias voltage, wherein a selector included in the oscillation circuit is configured to switch alternately between a non-conductive state and a conductive state to generate the oscillation signal. The oscillation detection circuit detects an onset of the oscillation signal, and outputs a lock signal upon a detection of the onset of the oscillation signal. The latch circuit latches the oscillation signal according to a trigger signal to output a random number, wherein the trigger signal is asserted after the lock signal is outputted by the oscillation detection circuit, and the configuration of the bias control signal is locked according to the lock signal.

In accordance with some embodiments, a method of generating a random number is introduced. The method includes steps of sweeping a configuration of a bias control signal among a plurality of configurations; generating a bias voltage based on the configuration of the bias control signal; generating an oscillation signal based on a bias voltage, wherein the selector switches alternately between a non-conductive state and a conductive state to generate the oscillation signal; detecting an onset of the oscillation signal and outputting a lock signal upon a detection of the onset of the oscillation signal; and latching the oscillation signal to output a random number according to a trigger signal, wherein the trigger signal is asserted after the lock signal is outputted, and the configuration of the bias control voltage is locked according to the lock signal.

In accordance with some embodiments, an operation method of a random number generator comprising an oscillation circuit, a control circuit, a dynamic header circuit, an oscillation detection circuit and a latch circuit is introduced. The operation method includes steps of sweeping, by a control circuit, a configuration of a bias control signal among a plurality of configurations; generating, by a dynamic header circuit, a bias voltage according to the configuration of the bias control signal; generating, by an oscillation circuit, an oscillation signal according to the bias voltage, wherein the oscillation circuit includes a selector and a capacitor, the selector switches between a conductive state and a non-conductive state alternately based on the bias voltage and the capacitor is charged and discharged alternately to generate the generate the oscillation signal; detecting, by an oscillation detection circuit, an onset of the oscillation signal, and outputting, by the oscillation detection circuit, a lock signal upon a detection of the onset of the oscillation signal, wherein the configuration of the bias control signal is locked according to the lock signal; and latching, by a latch circuit, the oscillation signal according to a trigger signal to output a random number, wherein the trigger signal is asserted after the lock signal is outputted by the oscillation detection circuit.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A random number generator, comprising:
    a control circuit, sweeping a configuration of a bias control signal among a plurality of configurations;
    a dynamic header circuit, generating a bias voltage based on the configuration of the bias control signal;
    an oscillation circuit, including a selector, generating an oscillation signal based on the bias voltage, wherein the selector switches alternately between a non-conductive state and a conductive state to generate the oscillation signal;
    an oscillation detection circuit, detecting an onset of the oscillation signal, and outputting a lock signal upon a detection of the onset of the oscillation signal; and
    a latch circuit, latching the oscillation signal according to a trigger signal to output a random number, wherein the trigger signal is asserted after the lock signal is outputted by the oscillation detection circuit,
    wherein the configuration of the bias control signal is locked according to the lock signal.

2. The random number generator according to claim 1, wherein the oscillation circuit further comprises:
    a capacitor, performing a charging operation when the selector is in the non-conductive state and performing a discharging operation when the selector is in the conductive state, wherein
    the selector includes an ovonic threshold switch that has a hold voltage and a threshold voltage, the selector switches from the non-conductive state to the conductive state when a voltage across the ovonic threshold switch exceeds the threshold voltage, and the selector switches from the conductive state to the non-conductive state when the voltage across the ovonic threshold switch decreases below the hold voltage.

3. The random number generator according to claim 2, further comprising:
    a resistor, coupled to the selector in series, clamping a peak transient current flowing through the selector.

4. The random number generator according to claim 1, wherein
    the dynamic header circuit comprises:
    a plurality of transistors, each of the plurality of transistors is weighted by a weight coefficient, and each of the plurality of transistors comprises:
        a control terminal, receiving the bias control signal;
        a first terminal, coupled to a reference node; and
        a second terminal, coupled to the oscillation circuit,
    wherein the plurality of transistors are configured to generate the bias voltage according to the bias control signal, and the oscillation circuit is biased by the bias voltage,
    wherein the weight coefficient of a transistor among the plurality of transistors corresponds to a size of the transistor.

5. The random number generator according to claim 1, wherein the oscillation detection circuit comprises:
    a rising edge detection circuit, detecting a rising edge of the oscillation signal; and
    a rising edge latch, coupled to the rising edge detection circuit, performing a latch operation to generate the lock signal when the rising edge detection circuit detects the rising edge of the oscillation signal.

6. The random number generator according to claim 1, wherein the oscillation detection circuit comprises:
    a falling edge detection circuit, detecting a falling edge of the oscillation signal; and
    a falling edge latch, coupled to the falling edge detection circuit, performing a latch operation to generate the lock signal when the falling edge detection circuit detects the falling edge of the oscillation signal.

7. The random number generator according to claim 1, wherein the oscillation detection circuit comprises:
    a rising edge detection circuit, detecting a rising edge of the oscillation signal;
    a falling edge detection circuit, detecting a falling edge of the oscillation signal;
    a rising edge latch, coupled to the rising edge detection circuit,
    a falling edge latch, coupled to the falling edge detection circuit,
    wherein the falling edge latch is electrically coupled to the rising edge latch, and oscillation detection circuit generates the lock signal in response to determining that a pair of the rising edge and the falling edge is detected.

8. The random number generator according to claim 1, wherein the oscillation detection circuit comprises:
    a rising edge detection circuit, detecting a rising edge of the oscillation signal;
    a falling edge detection circuit, detecting a falling edge of the oscillation signal;
    a plurality of rising edge latches, coupled to the rising edge detection circuit,
    a plurality of falling edge latches, coupled to the falling edge detection circuit, wherein each of the plurality of falling edge latches is electrically coupled to one of the rising edge latches,
    wherein the oscillation detection circuit generates the lock signal in response to determining that a plurality of pairs of the rising edge and the falling edges are detected.

9. The random number generator according to claim 1, further comprising:
    a first switch, coupled between the oscillation detection circuit and the oscillation circuit, decoupling the oscillation detection circuit from the oscillation circuit according to the lock signal.

10. The random number generator according to claim 1, further comprising:
    a first delay circuit, coupled between the control circuit and the oscillation detection circuit, delaying the lock signal to generate a first delay lock signal, wherein the control circuit locks the bias control signal when the first delay lock signal is generated by the first delay circuit.

11. The random number generator according to claim 1, further comprising:
a second delay circuit, coupled between the latch circuit and the oscillation detection circuit, delaying the lock signal to generate a second delay lock signal,
wherein the second delay clock signal is the trigger signal of the latch circuit, and the control circuit locks the bias control signal when to the lock signal is outputted by the oscillation detection circuit.

12. The random number generator according to claim 1, wherein the control circuit comprises:
a clock input terminal, receiving a clock signal;
a plurality of counter circuits, each of the plurality of counters outputs a bit value of the bias control signal according to the clock signal,
a second switch, coupled between the plurality of counter circuits and the clock input terminal, decoupling the plurality of counter circuits from the clock input terminal according to the lock signal, to lock the bias control signal.

13. The random number generator according to claim 12, wherein the control circuit further comprises:
a third delay circuit, delaying the lock signal to generate a third delay lock signal,
wherein the second switch decouples the plurality of counter circuits from the clock input terminal when the third delay lock signal is generated by the third delay circuit.

14. A method of generating a random number, adapted to a random number generator comprising a selector, the method comprising:
sweeping a configuration of a bias control signal among a plurality of configurations;
generating a bias voltage based on the configuration of the bias control signal;
generating an oscillation signal based on the bias voltage, wherein the selector switches alternately between a non-conductive state and a conductive state to generate the oscillation signal;
detecting an onset of the oscillation signal and outputting a lock signal upon a detection of the onset of the oscillation signal; and
latching the oscillation signal to output a random number according to a trigger signal, wherein the trigger signal is asserted after the lock signal is outputted, and the configuration of the bias control voltage is locked according to the lock signal.

15. The method of claim 13, wherein detecting the onset of the oscillation signal comprises:
detecting a rising edge or a falling edge of the oscillation signal; and
outputting the lock signal in response to detecting the rising edge or the falling edge of the oscillation signal.

16. The method of claim 13, wherein detecting the onset of the oscillation signal comprises:

detecting a pair of a rising edge and a falling edge of the oscillation signal; and
outputting the lock signal in response to detecting the pair of the rising edge and the falling edge of the oscillation signal.

17. The method of claim 13, further comprising:
delaying the lock signal to generate a delay lock signal, wherein the trigger signal is the delay lock signal.

18. An operation method of a random number generator comprising an oscillation circuit, a control circuit, a dynamic header circuit, an oscillation detection circuit and a latch circuit, the operation method comprising:
sweeping, by the control circuit, a configuration of a bias control signal among a plurality of configurations;
generating, by the dynamic header circuit, a bias voltage according to the configuration of the bias control signal;
generating, by the oscillation circuit, an oscillation signal according to the bias voltage, wherein the oscillation circuit includes a selector and a capacitor, the selector switches between a conductive state and a non-conductive state alternately and the capacitor is charged and discharged alternately to generate the generate the oscillation signal;
detecting, by the oscillation detection circuit, an onset of the oscillation signal, and outputting, by the oscillation detection circuit, a lock signal upon a detection of the onset of the oscillation signal, wherein the configuration of the bias control signal is locked according to the lock signal;
latching, by the latch circuit, the oscillation signal according to a trigger signal to output a random number, wherein the trigger signal is asserted after the lock signal is outputted by the oscillation detection circuit.

19. The operation method of the random number generator according to the claim 18, wherein
the selector comprising an ovonic threshold switch that is characterized by a hold voltage and a threshold voltage,
when a voltage across the ovonic threshold switch exceeds the threshold voltage, the selector switches from non-conductive state to the conductive state, wherein the voltage across the ovonic threshold switch is determined according to the bias voltage applied to the oscillation circuit,
when the voltage across the ovonic threshold switch decreases below the hold voltage, the selector switches from the conductive state to the non-conductive state,
the capacitor is discharged when the selector is in the conductive state, and
the capacitor is charged when the selector is in the non-conductive state.

20. The operation method of the random number generator according to the claim 18, further comprising:
switching off a switch coupled between the oscillation detection circuit and the oscillation circuit according the lock signal to decouple the oscillation detection circuit from the oscillation circuit after the lock signal is outputted by the oscillation detection circuit.

* * * * *